US005657758A

United States Patent [19]

Posse et al.

[11] Patent Number: 5,657,758
[45] Date of Patent: Aug. 19, 1997

[54] METHOD AND SYSTEM FOR MULTIDIMENSIONAL LOCALIZATION AND FOR RAPID MAGNETIC RESONANCE SPECTROSCOPIC IMAGING

[75] Inventors: Stefan Posse, Washington, D.C.; Denis LeBihan, Rockville, Md.

[73] Assignee: The United States of America as represented by the Secretary, Department of Health and Human Services, Washington, D.C.

[21] Appl. No.: 290,348

[22] Filed: Aug. 15, 1994

Related U.S. Application Data

[63] Continuation-in-part of Ser. No. 224,942, Apr. 8, 1994, abandoned.

[51] Int. Cl.⁶ ................................................. A61B 5/055
[52] U.S. Cl. .................... 128/653.2; 324/307; 324/309
[58] Field of Search ....................... 128/653.2; 324/307, 324/309

[56] References Cited

U.S. PATENT DOCUMENTS

| 4,563,647 | 1/1986 | Young | 324/309 |
|---|---|---|---|
| 4,585,993 | 4/1986 | Bottomley | 324/309 |
| 4,748,409 | 5/1988 | Frahm et al. | 324/309 |
| 4,777,439 | 10/1988 | Granot | 324/309 |
| 4,794,337 | 12/1988 | Twieg | 324/309 |
| 4,803,432 | 2/1989 | Perman | 324/309 |
| 4,804,920 | 2/1989 | McKinnon | 324/309 |
| 4,814,709 | 3/1989 | Takeda et al. | 324/309 |
| 4,866,386 | 9/1989 | Sattin | 324/312 |
| 4,878,021 | 10/1989 | Granot | 324/309 |
| 4,887,035 | 12/1989 | Hanawa | 324/309 |
| 4,894,616 | 1/1990 | Yoshitome et al. | 324/309 |
| 4,906,932 | 3/1990 | Ordidge | 324/309 |
| 4,924,183 | 5/1990 | Kunz et al. | 324/309 |
| 5,070,299 | 12/1991 | Kiefer et al. | 324/309 |
| 5,117,187 | 5/1992 | Granot | 324/309 |
| 5,124,650 | 6/1992 | Granot | 324/309 |
| 5,154,603 | 10/1992 | Sepponen | 128/653.2 |
| 5,159,550 | 10/1992 | Sakamoto et al. | 364/413.13 |
| 5,243,283 | 9/1993 | Tokunaga et al. | 324/306 |
| 5,245,282 | 9/1993 | Mugler, III et al. | 324/309 |
| 5,280,244 | 1/1994 | Hinks | 324/309 |

FOREIGN PATENT DOCUMENTS

0184840  6/1986  European Pat. Off. .

OTHER PUBLICATIONS

Frahm et al, Stimulated Echo Imaging, *Journal of Magnetic Resonance* 64, 81–93 (1985).

D.C. Shungu, J.D. Glickson: "Sensitivity and Localization Enhancement in Multinuclear in Vivo NMR Spectroscopy by Outer Volume Saturation"; Magn. Res. Med. 30, 661–671 (1993).

(List continued on next page.)

*Primary Examiner*—Ruth S. Smith
*Attorney, Agent, or Firm*—Morgan & Finnegan, L.L.P.

[57] ABSTRACT

A method and system for providing prelocalization of a volume of interest and for rapidly acquiring a data set for generating spectroscopic images. Spatial prelocalization of a volume of interest is achieved by providing a presuppression sequence before a stimulated echo (STE) sequence and a suppression sequence during the mixing time (TM) interval of the STE sequence. The presuppression sequence includes a spatial suppression sequence to selectively saturate slices that intersect the plane selected by the STE sequence in order to define a boundary for the volume of interest, and this spatial suppression sequence is substantially repeated during the TM interval of the STE sequence. Spectroscopic imaging data is acquired by an oversampled echo planar spatial-spectral imaging sequence in which the gradient reversal frequency is a integer factor of n greater than the gradient reversal frequency required to sample the spectral width. Each RF pulse of the STE sequence excites spins in substantially the same plane, and an adaptation of this STE sequence provides for acquiring multiple echoes at different effective echo times without compromising spatial localization of the different echoes.

16 Claims, 12 Drawing Sheets

OTHER PUBLICATIONS

Ch. T.W. Moonen, P.C.M. van Zijl: "Higly Effective Water Suppression for in Vivo Proton NMR Spectroscopy (DrySteam)"; J. Magn. Res. 88, 28–41 (1990).

L. Li and Ch.H. Sotak: "A Method for Evaluating Anisotropic and Restricted Diffusion by Simultaneous Use of Spin and Stimulated Echoes"; J. Magn. Res. 56, 501–513 (1992).

R. Kimmich et al. "Volume–Selective Multi–Pulse Spin–Echo Spectroscopy and Selective Suppression of Spectral Lines" *Physics in Medicine and Biology*, vol. 32, London GB, pp. 1335–1343 (1987).

J. Frahm et al. "Localized Proton Espectroscopy Using Stimulated Echoes" *Journal of Magnetic Resonance*, vol. 72, Duluth USA, pp. 502–508, (1987).

METHOD AND SYSTEM FOR MULTIDIMENSIONAL LOCALIZATION AND FOR RAPID MAGNETIC RESONANCE SPECTROSCOPIC IMAGING

This application is a continuation-in-part of U.S. application Ser. No. 08/224,942, filed Apr. 8, 1994, now abandoned.

TECHNICAL FIELD

The present invention relates generally to the acquisition of nuclear magnetic resonance data and, more particularly, to a method for spatial localization and for rapidly acquiring magnetic resonance information either for magnetic resonance spectroscopy (MRS) or magnetic resonance imaging (MRI).

BACKGROUND OF THE INVENTION

Nuclear magnetic resonance (NMR) techniques have long been used to obtain spectroscopic information about substances, revealing the substance's chemical composition. More recently, spectroscopic imaging techniques have been developed which combine magnetic resonance imaging (MRI) techniques with NMR spectroscopic techniques, thus providing a spatial image of the chemical composition.

In recent years there has been increasing interest in the study of brain metabolism using proton MR spectroscopy and spectroscopic imaging because of its noninvasive assessment of regional biochemistry. While proton spectroscopy measures metabolite levels in a single volume, proton spectroscopic imaging (HSI) measures the spatial distribution of metabolites (e.g., N-acetylaspartate (NAA), total choline, total treating, and lactate) over a predetermined volume of interest (VOI). HSI studies of the brain have shown locally altered metabolite levels in different pathologies, including brain tumors, multiple sclerosis, chronic and acute brain infraction, epilepsy and acquired immunodeficiency syndrome.

HSI requires spatial prelocalization of a volume of interest (VOI) to suppress overwhelming water and fat signals from superficial structures (bone, muscle, skin) which may lead to spectral artifacts in the region of interest. This prelocalization may be done by selective excitation of a rectangular volume using three-pulse localization schemes (e.g., using stimulated echo methods "STEAM"), by spatial suppression of outside volumes or by a combination of both. The degree of prelocalization with these methods is limited by imperfections in the field homogeneity of the radiofrequency coil, by intrinsic static magnetic field inhomogeneities in vivo, by relaxation processes and by limitations in gradient power. To improve the prelocalization a combination of selective excitation of the volume of interest and presaturation of outside volumes has been proposed. However, this approach is limited to the selection of rectangular volumes which do not follow the contours of organs such as the brain and is motion sensitive due to the application of strong gradient dephasing pulses for the STEAM localization sequence. To obtain a more flexible volume preselection a different technique has been proposed recently where selective excitation with a spin echo pulse sequence is used in one dimension and spatial presaturation of peripheral regions is used in the other dimensions. However, with this approach the degree of volume prelocalization is limited, since spatial presaturation in vivo provides suppression factors of less than 100 (under favorable conditions) which leaves strong residual water and fat signals from peripheral regions. The technique has thus been used only at long echo times (272 ms) where water and fat signals strongly reduced as compared to metabolite signals due to their shorter transverse relaxation times and J-coupling. However, many metabolite signals also suffer strong signal losses at long echo times for the same reasons, and further, additional information is available at short echo times that is not present at long echo times. Concomitantly, most prior art localization techniques are not applicable to acquiring multiple volume data from nuclei that have a short $T_2$ relaxation time, such as the phosphorus-31 (31P) nucleus or the sodium-23 (23Na) nucleus. Similarly, 31P and 23Na MRI and spectroscopic imaging provide additional information not found in HSI.

Thus, there is a need for improvements in techniques for prelocalizing a volume of interest, and preferably such improved techniques should render short echo time spectroscopic imaging practicable in order to elucidate additional spectral information which is not available at long echo times.

Another inherent requirement of spectroscopic imaging is that the pulse sequence for acquiring data encodes spectral information in addition to spatial information. This requirement presents additional problems and challenges in order to make spectroscopic imaging practicable. Some of the problems that must be addressed include: minimizing the deleterious coupling or overlap effects between the spectral encoding and the spatial encoding; minimizing the time required for acquiring the spectral and spatial information; increasing the signal-to-noise ratio; and increasing the spatial resolution of the spectral information. It is well recognized that many of these problems are related in a fundamental and/or practical manner, and thus, improving a given parameter may result in, or require, compromising another parameter. Indeed, however, one of the foremost limitations to clinical application of HSI is the length of time needed for data acquisition in order to provide images with sufficient spatial and spectral resolution. Particularly in the case of severely ill or instable patients, such study lengths prohibitive.

Recent technical developments have sought to reduce the generally long acquisition times necessary for spectroscopic imaging. Three-dimensional phase encoding: is desirable, since it yields complete volume coverage, permits thin slices and avoids chemical shift artifacts. However, phase encoding is very time consuming. Multislice techniques have been introduced as an alternative to reduce data acquisition times, but the number of slices with these techniques is limited due to the long data acquisition window. More recently, shorter acquisition times have been achieved by acquiring multiple individually phase encoded echoes during a single excitation. This method increases the signal-to-noise per unit time and unit volume, but introduces variable T2-weighting in k-space and is not compatible with short echo time acquisitions. Alternative approaches using fast imaging techniques with a Dixon-type echo time shifting to encode spectral information have been shown to be feasible, albeit at the expense of spectral resolution. In sum, these methods are not suitable for short echo time acquisitions.

Echo-planar spectroscopic imaging (EPSI), a much faster method proposed by Mansfield, (P. Mansfield, "Spatial Mapping of the Chemical Shift in NMR", J. of Physics D: Applied Physics, vol. 16 (1983), pp. L235-L238), and further developed by others, avoids these limitations by using a series of periodically inverted gradients to generate a train of echoes which contain both spatial and spectral information, thus permitting complete three-dimensional spatial encoding in a clinically reasonable time frame. EPSI, however, requires strong fast switching gradients with excellent eddy current performance. Further, due to the inherent convolution of the spatial and spectral information, spectral aliasing artifacts and localization constraints have precluded applications beyond initial feasibility studies.

Therefore, there is also a need for improved methods for acquiring spectroscopic data rapidly, without loss in spectral resolution or spatial localization.

SUMMARY OF THE INVENTION

The present invention provides a method for acquiring a data set for generating spectroscopic images which is not limited by the disadvantages of the prior art. The invention involves the application of a pulse sequence to a conventional magnetic resonance imaging (MRI) apparatus in order to rapidly acquire data for generating spectroscopic images. Spatial prelocalization of a volume of interest is achieved by providing a presuppression sequence before a stimulated echo (STE) sequence and a suppression sequence during the mixing time (TM) interval of the STE sequence. Preferably, the STE sequence includes three substantially 90° RF pulses each applied in combination with a respective gradient magnetic field to select the same slice in a desired orientation. The presuppression sequence includes a spatial suppression sequence to selectively saturate slices not in the same plane as the STE slice in order to define a boundary for the volume of interest, and this spatial suppression sequence is substantially repeated during the TM interval of the STE sequence. Preferably, the presuppression and the suppression sequences each include a chemical shift saturation for water suppression.

Also in accordance with the present invention, a method for acquiring spectroscopic imaging data is based on an oversampled echo planar spatial-spectral imaging sequence. In order to sample a predetermined spectral width in individual spectra, a gradient reversal frequency that is an integer factor of n greater than the gradient reversal frequency required to sample the spectral width is used. Spatial resolution and field of view is maintained by adjusting the gradient magnetic field strength, specifically requiring an n-fold increase in gradient magnetic field strength as compared to a prior art echo planar spectroscopic imaging sequence that does not include oversampling (i.e., n=1). For three-dimensional imaging, the other two spatial dimensions are encoded by conventional phase encoding. The n series of positive and negative echoes are reconstructed separately and then combined.

In addition, the present invention provides a stimulated echo pulse sequence for acquiring multiple echoes at different effective echo times without compromising spatial localization of the different echoes. Such a method comprises applying a stimulated echo pulse sequence to induce a stimulated echo and a spin echo signal in a volume of interest, applying a rephasing magnetic field gradient to compensate for dephasing of spins associated with the spin echo signal, and acquiring the stimulated echo and the spin echo signal.

BRIEF DESCRIPTION OF THE DRAWINGS

Additional aspects, features, and advantages of the invention will be understood and will become more readily apparent when the invention is considered in the light of the following description made in conjunction with the accompanying drawings, wherein.

DETAILED DESCRIPTION OF THE PREFERRED EMBODIMENT

Figure 1:
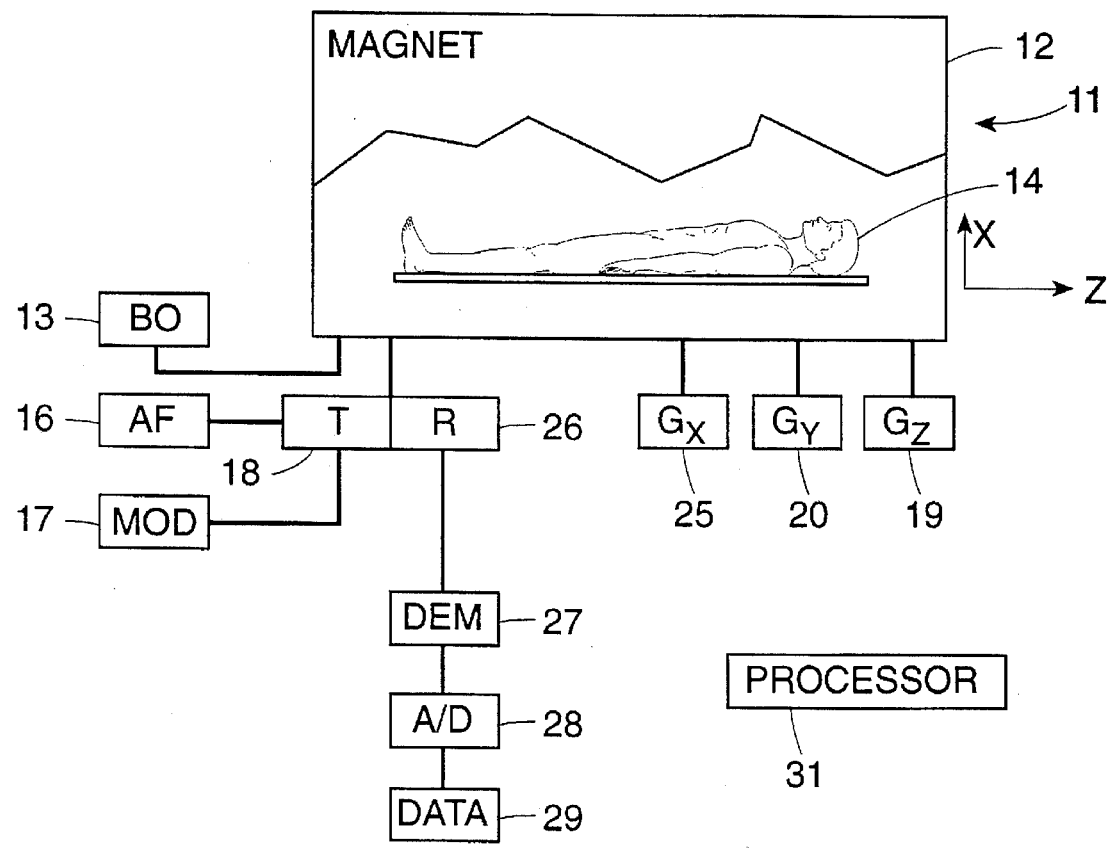
FIG. 1 is a block diagram of a magnetic resonance (MR) system used in accordance with the present invention.

Before consideration in detail of the present invention, a brief overview of a conventional MRI system is in order. In particular, FIG. 1 shows in block diagram form an in vivo NMR imaging system which is capable of receiving a patient 14. The system includes a magnet 12 for generating a large static magnetic field. The magnet is sufficiently large to have a bore into which a patient 14 can fit. The patient 14 is positioned and the magnetic field is generated by a magnetic field generator indicated at 13 by block $B_o$. RF pulses are generated utilizing RF generator 16, and the RF pulses are shaped using modulator 17. The shape of a modulated pulse could be any predetermined shape, and for example may be Gaussian or Sinc (i.e., sin(bt)/bt, where b is a constant, and t is time). Shaped pulses are usually employed in order to shape and limit the bandwidth of the pulse, thereby restricting excitation by the RF pulse to spins that have Larmor frequencies within the RF pulse bandwidth. A RF pulse signal is transmitted to coils in the magnet assembly which are not shown. The coils may be surface coils, body coils, limb coils or head coils, for example. The duration and amplitude of the RF pulse determine the mount which the net magnetization is "tipped". As will be described below, in a preferred embodiment of the invention tip angles of substantially 90° are employed for a stimulated echo pulse sequence.

Gradient generators 25, 20, and 19, which include respective gradient coils, produce the $G_x$, $G_y$, and $G_z$ magnetic fields in the direction of the polarizing magnetic field $B_o$, but with gradients directed in the x, y, and z directions, respectively. The use of the $G_x$, $G_y$, and $G_z$ magnetic field gradients is well known in the art, including such uses as dephasing or rephasing excited spins, spatial phase encoding or spatial gradient encoding acquired signals, and spatial encoding of the Larmor frequency of nuclei for slice selection.

Induced nuclear magnetic resonance signals are detected by receiver coils in the magnet which are not shown. The receiver coils and the transmitter coils may be the same, with a transmit/receive (T/R) switch 26 being used to select transmission or reception of radio frequency signals to or from the coils, respectively. The received signal is demodulated by demodulator 27, and the demodulated signal is amplified and processed in the analog-to-digital processing unit 28 to provide data as indicated at 29. The entire process is monitored and controlled by the processor 31 which, according to the functional block diagram of FIG. 1 and to components found in known commercial or experimental systems that are used to control mad monitor the entire process, includes components necessary to control the timing, amplitudes and shapes of the control signals for the various elements of the MRI system and typically includes programming, computing, and interfacing means.

Figure 2A:
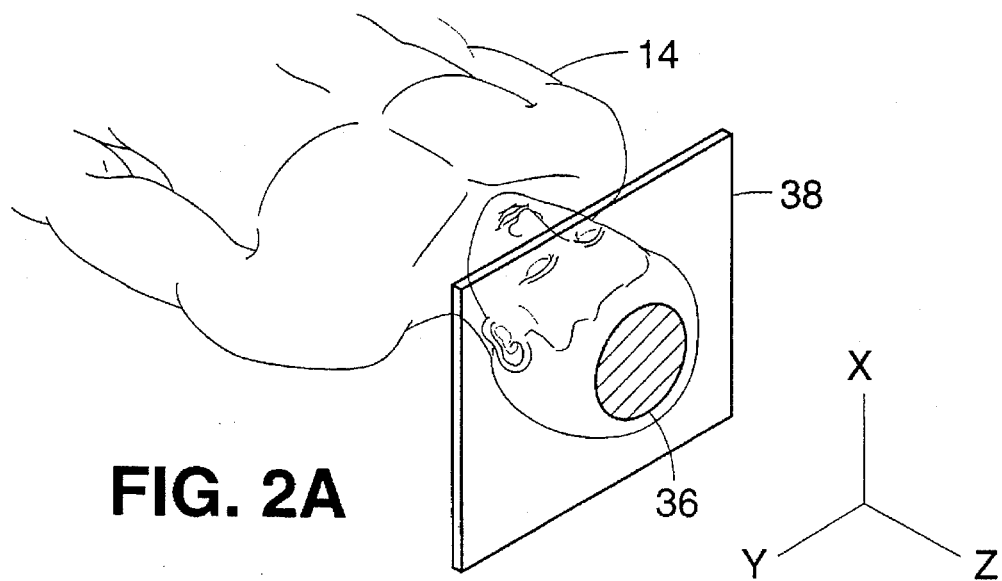
FIG. 2A is a pictoral view of a patient which shows an arbitrary volume of interest that may be prelocalized and spectroscopically imaged in accordance with the present invention.

In FIG. 2A, a three-dimensional slice (or slab) 38, represents a three-dimensional section of the patient 14. It is an aim of the system and method described herein to provide spatial prelocalization of a region or volume of interest (VOD, such as VOI 36, within slice 38. Moreover, the system and method as will be described is especially designed to obtain spectroscopic data for multiple localized regions within the VOI 36. The volume of interest, the boundaries of which are defined by a process herein referred to as "prelocalization", is typically a slice or slab, and a localized region, may be either a two-dimensionally localized region or a three-dimensionally localized volume element.

Figure 3:
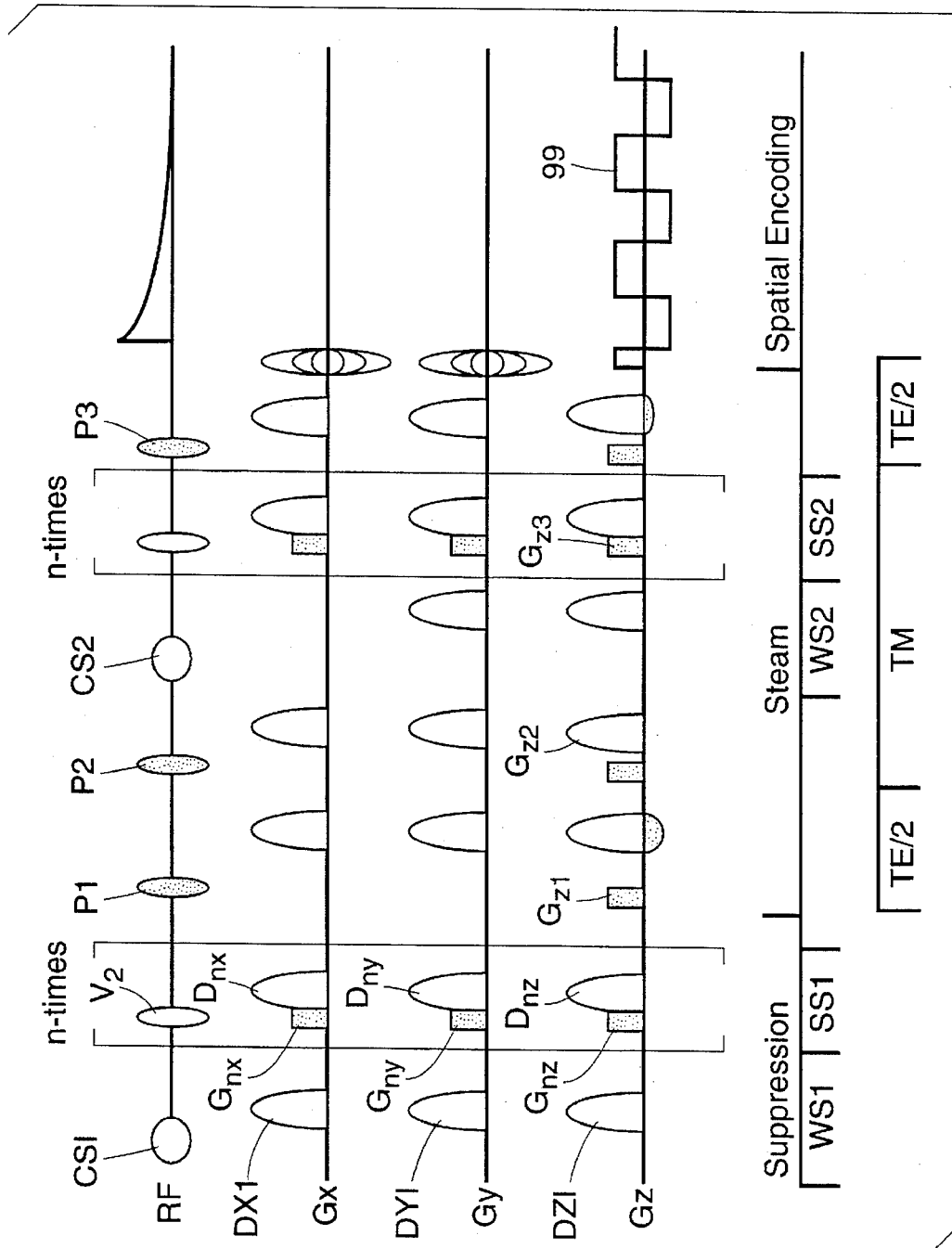
FIG. 3 is a schematic depiction of a pulse sequence, including three-dimensional spectroscopic imaging, in accordance with the present invention.

Referring now to FIG. 3, a pulse sequence in accordance with an embodiment of the present invention is shown. The pulse sequence, which is further described hereinbelow, consists essentially of three parts: a spectral-spatial presuppression sequence, a basic three-pulse stimulated echo (STE) sequence which includes a spectral-spatial suppression sequence during the TM interval, and an echo-planar spatial-spectral encoding gradient sequence.

STIMULATED ECHO (STE) LOCALIZATION

In accordance with the present invention, spatial prelocalization of a VOl is provided by a spectral-spatial presuppression sequence and a basic three-pulse STE sequence which includes a spectral-spatial suppression sequence during the $T_m$ interval.

A basic three-pulse STE sequence, comprising substantially 90° RF pulses P1, P2, and P3 results in the generation of an echo signal delayed after pulse P3 by a time interval approximately equal to the time interval between pulse P1 and pulse P2 (i.e., TE/2). The interval between P2 and P3 is referred to as the mixing time interval or TM interval. In an embodiment of the present invention, each pulse P1, P2, and P3 is a frequency selective (e.g., shaped) pulse, and a magnetic gradient field is applied in conjunction with each 90° RF pulse in order to select a slice or slab oriented in a plane of preferred orientation. Although any spatial orientation of the plane is possible, for purposes of discussion it is assumed that the STE selected slice is oriented in a plane that is perpendicular to the direction of the applied magnetic gradient field. Preferably, in accordance with an embodiment of the present invention, the same slice is selected by each slice selection combination of a frequency selective RF pulse and an applied gradient magnetic field, and accordingly, in the pulse sequence of FIG. 3 $G_{x1}$, $G_{x2}$, and $G_{x3}$ are all applied in the z-direction. It is noted that during the TM interval, the spins excited by P1 and P2 within the VOI are directed along the z axis, and therefore, the spin-spin interaction, characterized by the $T_2$ relaxation time, is in abeyance.

Prior to application of the basic STE pulse sequence, a presuppression sequence is applied. Preferably, the presuppression sequence includes a water suppression sequence, shown as interval WS1, and a spatial suppression sequence, shown as interval SS1. Interval WS1 includes a chemical shift selective (CHESS) excitation pulse CS1 for water saturation, which is preferably followed by one or more gradients, shown as DX1, DY1, and DZ1, to dephase the spins excited by the pulse CS1. According to known methods, the pulse CS1 is specifically shaped or modulated to excite only a narrow frequency band around the water resonance, and its amplitude is sufficient to cause saturation.

Figure 2B:
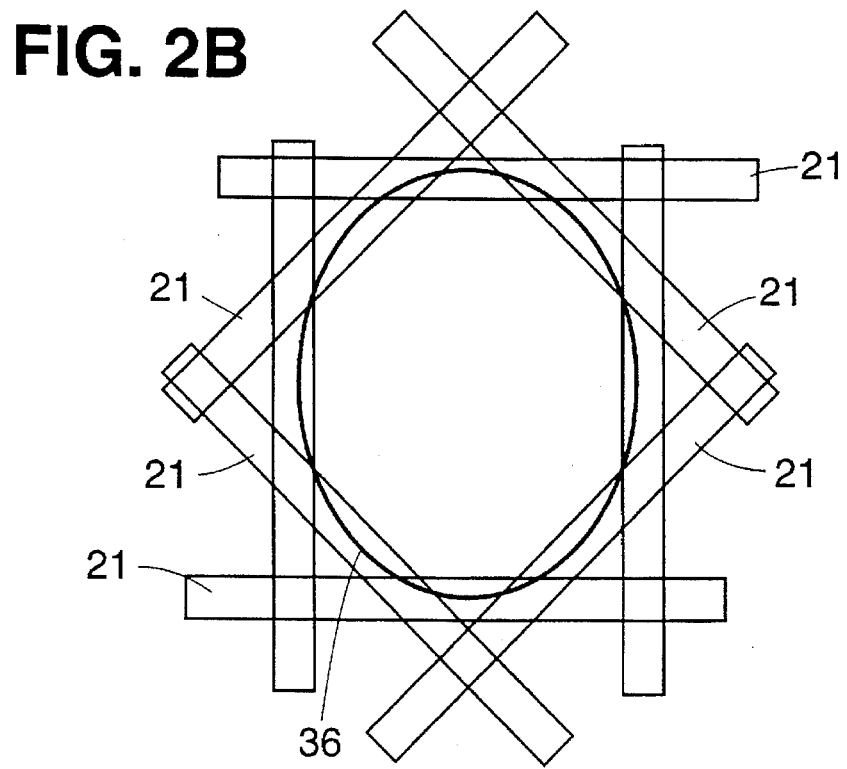
FIG. 2B illustrates prelocalization of a volume of interest, in accordance with the present invention.

The presuppression sequence also includes a spatial suppression interval SS1 during which time n slices are selected for suppression, where n is generally any integer value. Preferably, these suppression pulses are directed to lipid suppression. As shown schematically in FIG. 3, a suppression slice is selected by applying a shaped RF pulse $V_x$ in conjunction with a linear combination of orthogonal gradient magnetic fields $G_{xx}$, $G_{xy}$, $G_{xz}$, followed by an appropriate dephasing gradient $D_{xx}$, $D_{xy}$, $D_{xz}$. Preferably, for localization of a VOI such as VOl 36 of FIG. 2A, a series of selective suppression pulses are generated, each of which suppresses a different slice positioned along the periphery of the VOI and orthogonal to the slice to be selected by the STE sequence, the overlap of the selective suppression pulses encompassing the VOl. The intersection of suppression slices 21 to encompass the VOI 36 is schematically shown in FIG. 2B.

After the presuppression sequence, as described above all three STE pulses are available to select the same slice in the third dimension. In accordance with the present invention, the series of suppression pulses in SS1 and repeated in the SS1 interval during the TM period, thereby providing marked improvement in suppression. Preferably, the chemical shift selective excitation pulse sequence is also repeated during the TM period (i.e., WS2) to enhance water suppression. It is emphasized that the specific gradient, dephasing, and RF pulses shown in interval SS1 (as well as SS2) are merely schematic, and that actual pulse sequences during the SS1 (and SS2) interval will depend on many factors including the desired number orientation of the suppression slices, as well as the preferred suppression technique.

It is understood that in accordance with the multidimensional spatial suppression sequence, any number of spatial suppression pulses may be employed to shape the volume of interest with great flexibility. The suppression slices need not be limited to being orthogonal to the slice selected by the STE pulses. For instance, suppression slices may be selected parallel to, and above and below, the STE pulse selected slice in order to enclose the volume of interest in all dimensions. As a further example of a prior art method for selecting the suppression slices, two 90° pulses having different frequency spectra may be applied simultaneously during the application of a given gradient magnetic field in order to suppress signals from parallel slices separated according to the respective frequency spectrums of the two 90° pulses. It is further understood that each suppression sequence (i.e., WS1:SS1 and WS2:SS2) may include any known spectral and/or spatial suppression techniques.

It can also be appreciated that the pulse sequences employed during the WS1 and SS1 intervals need not be identical to those during the WS2 and SS2 intervals, respectively. For instance, in order to reduce losses in saturation due to T1 relaxation, it may be desirable to use broader band (i.e., "harder") RF pulses during the presuppression SS1 interval than during the SS2 interval in which the RF pulses would have greater frequency selectivity to better define the volume of interest. That is, because T1 relaxation may have a noticeable deleterious effect on the efficiency of presuppression, but has a negligible effect on the efficiency of suppression performed during the TM interval, for a given STE interval it may be preferable to reduce the time period over which T1 decay occurs for the presuppression sequence by decreasing the duration of the presuppression sequence by using RF pulses of shorter duration. Of course, it is possible to use "harder" suppression pulses during the TM interval than during the presuppression interval to reduce the potential effects of coupling between spins on the spectra, which are more prominent at longer echo times. Another example of variations that may be desired is to include spatial suppression pulses to define the top and bottom regions of the selected slice (i.e., planes parallel to the selected slice) during the SS2 interval, but not to include these pulses during the SS1 interval. Or alternatively, several optimized chemical shift selective pulses may be employed during SS1, while only one chemical shift selective pulse may be employed during SS2.

As may be appreciated by one skilled in the art, although in the embodiment shown in FIG. 3 the same slice is selected by each STE RF pulse and magnetic field gradient combination, the present invention may be practiced with variations of these particular pulse sequences. For instance, each STE RF pulse may be associated with an applied magnetic field gradient that is orthogonal to the other magnetic field gradients. Alternatively, no magnetic field gradient may be applied during the third RF pulse in order to avoid eddy current effects. It is also understood, however, that the absence of applied orthogonal magnetic field gradient components during the STE localization sequence avoids the deleterious effects due to magnetic gradient field misalignment or miscalibration, and that repeated selection of the same slice provides enhanced localization in the direction of the applied magnetic field gradient and reduces the need for additional outer-volume suppression or dephasing gradients for the non-selected region outside of the desired slice. That is, in contrast to conventional STEAM localization schemes, since the magnetization above and below the volume of interest is not touched, gradient dephasing requirements and motion sensitivity are reduced despite the elongated TM period for additional suppression.

Due to the improved spatial prelocalization provided by the present invention, it is possible to use very short echo times without introducing localization errors. Tires, metabolites with strong J-modulation and short transverse relaxation times may be measured using a much more flexible volume prelocalization as compared to previous methodology. Due to the additional spatial presaturation pulses the mixing interval has to be elongated at the expense of signal losses due to longitudinal relaxation and due to modulation of signal losses due to longitudinal relaxation and due to modulation from J-coupling. However, these losses be kept small with the use of short RF and gradient pulses and the use of short echo times.

OVERSAMPLED ECHO-PLANAR SPECTROSCOPIC IMAGING (EPSI)

In a preferred embodiment of the present invention, a sequence for obtaining data is an n-fold oversampled echo-planar spectroscopic imaging (EPSI) sequence for encoding both spatial and spectral information, shown generally in FIG. 3 as echo-planar sequence 99. The increased acquisition speed of EPSI directly results from the continuous simultaneous encoding of spectral and spatial information and thus, convolution of spectral and spatial information is inherent.

Figure 4C:
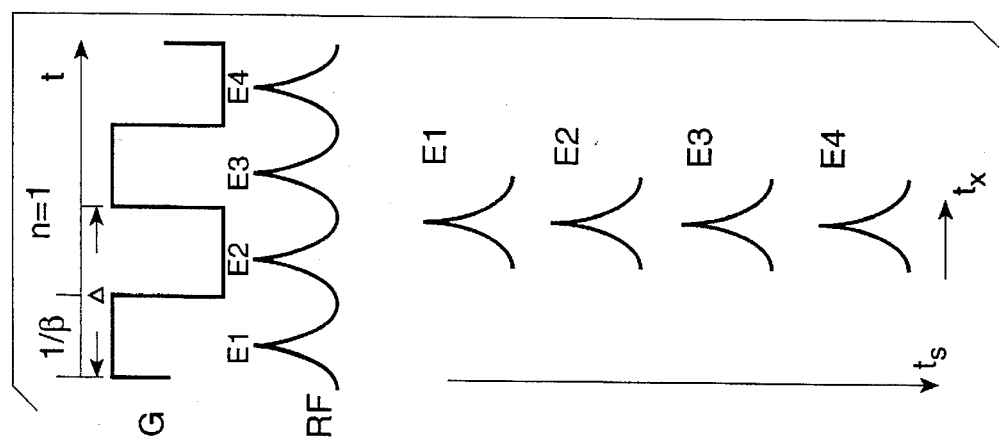
FIG. 4B and FIG. 4C each show an oversampled echo planar spatial-spectral acquisition sequence, in accordance with the present invention.
Figure 4B:
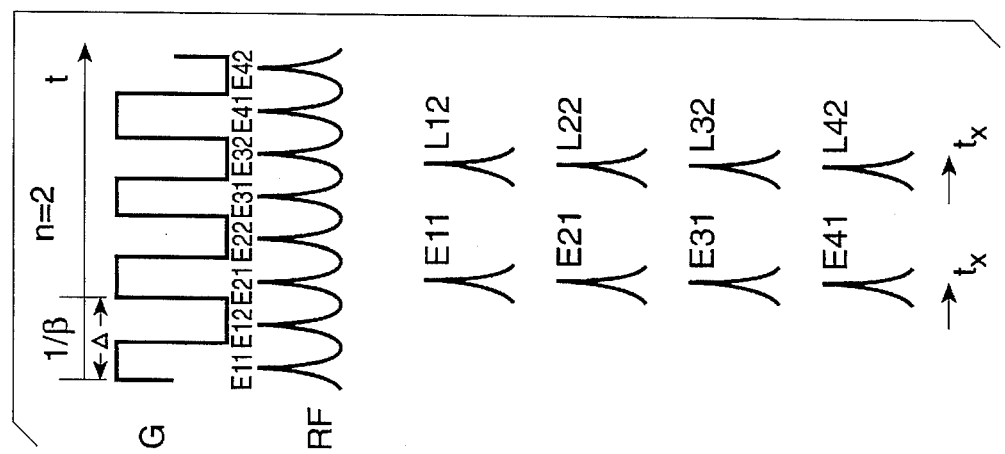
Figure 4A:
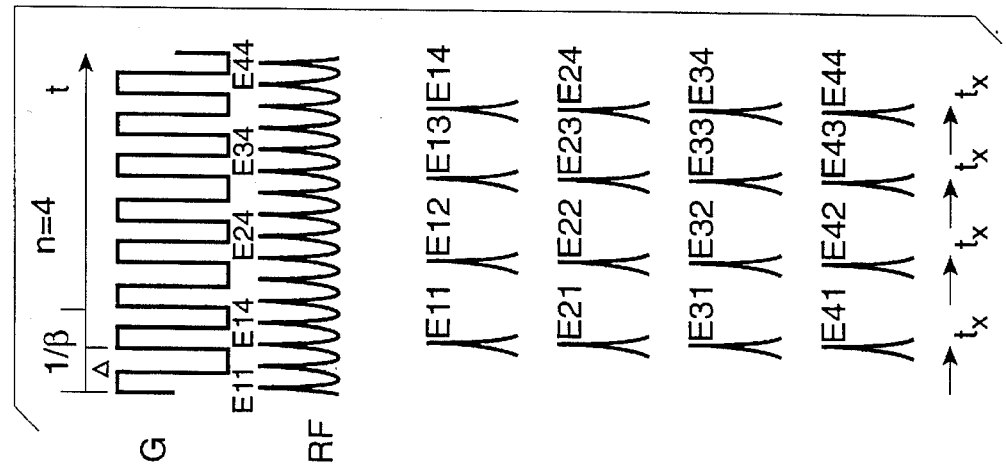
FIG. 4A shows an echo planar spatial-spectral acquisition sequence, in accordance with the prior art.
Figure 5:
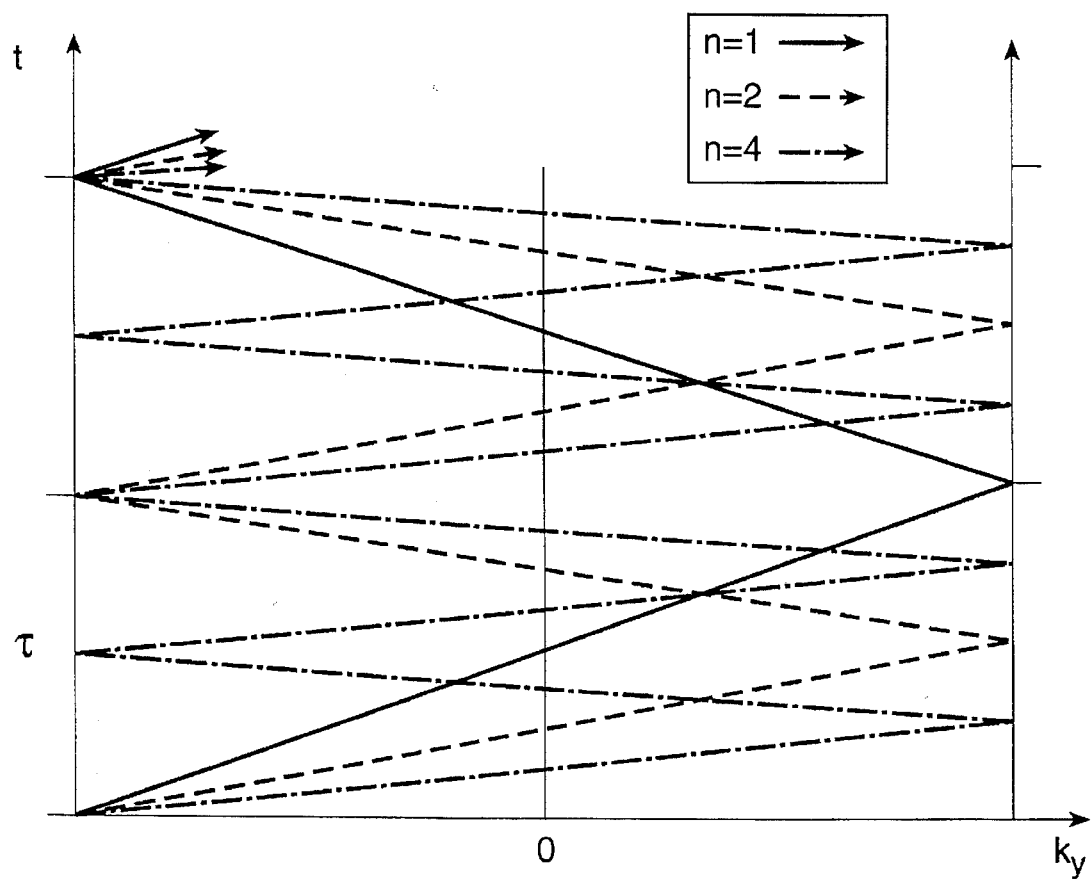
FIG. 5 illustrates and compares the k-space sampling trajectories according to the prior art and to the present invention.

Echo-planar spatial-spectral encoding according to the present invention may be described more specifically by referring to FIGS. 4A–4C. FIG. 4A shows a conventional echo planar spatial-spectral encoding sequence that encodes one dimension of k-space (e.g., all sampled values of $k_x$) corresponding to one spatial dimension, and the full spectroscopic dimension for each excitation (e.g., echo). Each reversal of the gradient magnetic field G refocuses the echo signal, thus providing an echo train E1, E2, E3, E4, for example. The echo train contains spatial information encoded in the shape of each echo and spectral information encoded in the signal change from echo to echo (i.e., E1 to E2 to E3, etc.). It is understood that the desired spectral bandwidth, $\beta$, is determined by time period between echoes in the $t_s$ dimension which for the conventional EPSI sequence equals one-half the readout gradient pulse periodicity $\Delta$, the spectral resolution is determined by the number of echoes in the echo train, the spatial resolution is determined by the time integral of the magnetic field gradient over the time period between gradient reversals (i.e., the maximum spatial frequency), and the field of view is determined by the sampling frequency for acquiring a given echo. FIG. 5 illustrates the k-space encoding scheme for the conventional EPSI readout gradient of FIG. 4A, in which the length of each gradient pulse, $\tau$, corresponds to the inverse of the spectral width in the reconstructed spectra.

As discussed hereinabove, chemical shift evolution during the acquisition of a single echo and smile magnetic field inhomogeneities distort the localization. Echoes are time shifted depending on the strength and the orientation of these interactions, thereby introducing asymmetry in the echo train. This asymmetry can only be partly recovered during postprocessing by reversing the echoes acquired with negative gradients or by other correction schemes. More specifically, evolution in time convolves spectral and spatial information which leads to chemical shift artifacts. Also, reversal of the readout gradient in the presence of local magnetic field inhomogeneities and asymmetries in gradient switching introduce periodicities in k-space which lead to aliasing artifacts. A prior art technique for removing aliasing is based on separating (editing) the echoes obtained with positive and negative gradients at the expense of reducing the spectral width to ½τ, where τ is the time duration of a readout gradient pulse.

In accordance -with the present invention, and as will be further understood hereinbelow, in order to simultaneously reduce chemical shift artifacts and eliminate aliasing while retaining the desired spectral width (1/τ), an EPSI sequence is employed with n-fold oversampling in the time domain. The n-fold oversampling comprises an n-fold increase in the read out gradient strength, and an n-fold increase in the read out gradient frequency (i.e., maintaining a constant total time integral of the readout gradient pulse which corresponds to the spatial resolution). FIG. 4B and FIG. 4C illustrate a two-fold and a four-fold oversampled EPSI sequence, respectively, according to the present invention. FIG. 5 illustrates the k-space trajectory as a function of time for a two-fold oversampled EPSI sequence, and a four-fold oversampled EPSI sequence, corresponding respectively to FIG. 4B and FIG. 4C, as compared to the trajectory corresponding to the above-described, original encoding scheme proposed by Mansfield, referenced hereinabove, where the length of each gradient pulse (τ=1/β) corresponds to the inverse of the spectral width in the reconstructed spectra.

Since, in accordance with the present invention, the read out gradient strength increases n-fold, the displacement effects of chemical shift and internal gradients are reduced n-fold. As illustrated in FIG. 4B and FIG. 4C, the n series of positive and negative echoes are reconstructed separately (edited) to avoid ghosting artifacts from gradient reversal. Particularly, it is understood that the n-fold oversampling provides for use of the known technique of separately reconstructing positive and negative echoes to avoid ghosting artifacts from gradient reversal, but without sacrificing spectral width.

It is noted that although due to the n-fold increase in the gradient reversal frequency the spectral width of the whole data set increases n-fold with a sqrt(n)-fold increase in noise, the signal to noise ratio is fully recovered by combining (e.g., averaging) the n series of localized spectra after reconstruction. This aspect of the echo editing is important since, as described above, the convolution of the spectral and spatial information is inherent to EPSI, and it may intuitively appear that reducing the chemical shift effects on the spatial encoding (i.e., improving localization) by increasing the gradient magnetic field strength could only be achieved to the detriment of the chemical shift information (i.e., reducing signal-to-noise). Also, although the method requires faster gradient rise times and stronger amplitudes it is feasible with currently available gradient technology as shown below.

In accordance with the present invention, then, echo planar spectroscopic imaging in one dimension with n-fold oversampling in the time domain and subsequent echo editing is provided to reduce displacement artifacts n-fold and to avoid aliasing without sacrificing spectral width or signal to noise. Thus, the rapid acquisition associated with echo-planar imaging is made practicable for spectroscopic imaging, concomitantly rendering spectroscopic imaging more practicable as a diagnostic modality.

In accordance with volume encoding, the n-fold oversampled echo-planar spectroscopic imaging sequence is performed in one direction to encode the spatial information for that direction, in addition to spectroscopic information (e.g., the z direction), while the other two spatial dimensions are encoded by conventional phase encoding, as shown in FIG. 3.

It may be understood that in accordance with the present invention, the spatial encoding direction of the echo-planar sequence may be in any one of the magnetic field gradient directions. The orientation of the echo-planar pulse sequence may be selected in accordance with the desired resolution, and other spectral and spatial parameters. For example, provided that a sufficient sampling rate is possible, the gradient direction of the echo-planar spectroscopic sequence may be selected as the spatial direction requiring the largest field of view.

Figure 6:
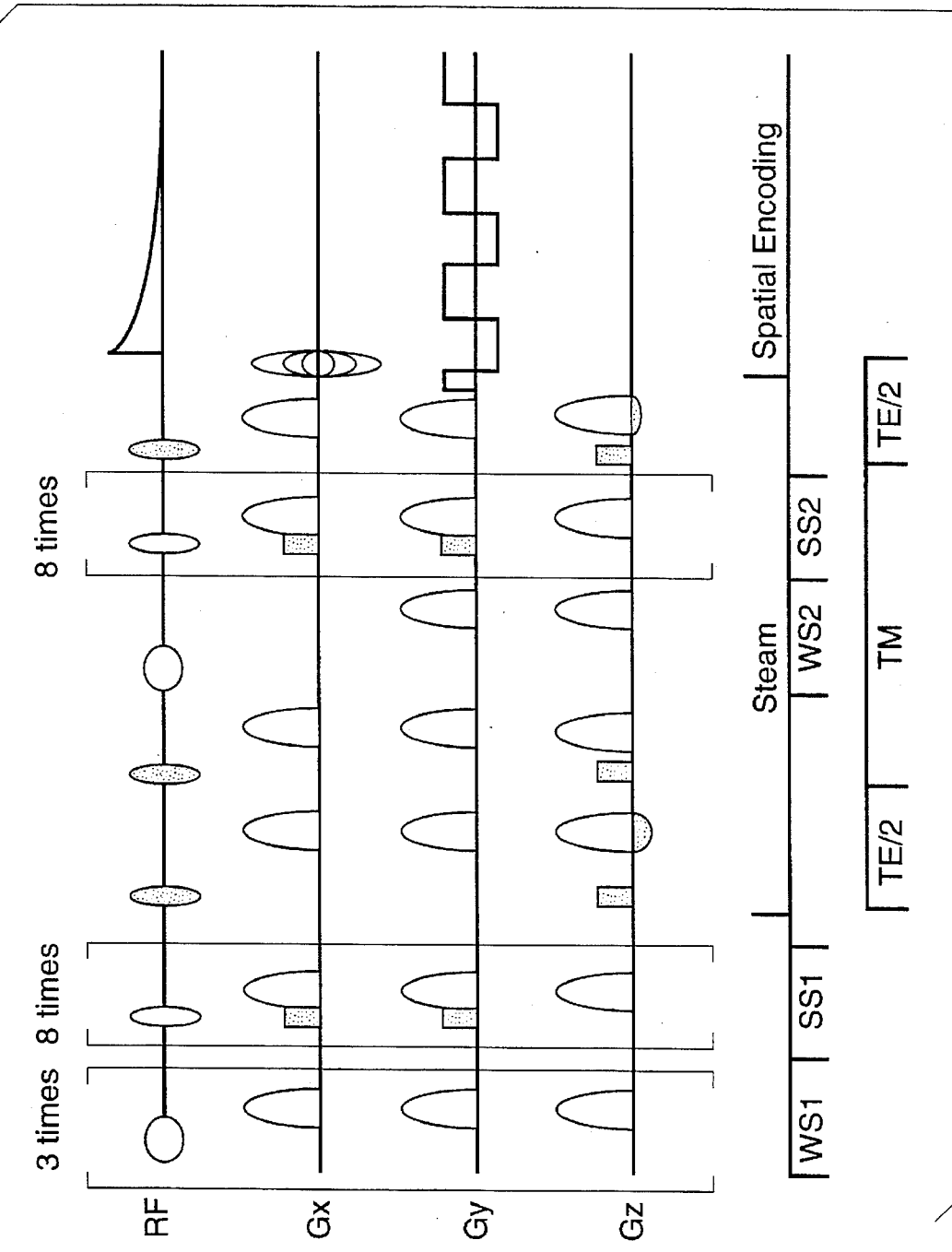
FIG. 6 is a schematic depiction of a pulse sequence, including two-dimensional spectroscopic imaging, in accordance with the present invention.

It may also be appreciated that in accordance with the echo-planar acquisition sequence of the present invention, three-dimensional encoding is not necessary, and it may sometimes be advantageous or preferable for purposes of rapid acquisition, for example, to acquire spectroscopic information for a two-dimensional spatial slice, or multiple two-dimensional spatial slices (e.g., using multi-slice techniques). FIG. 6 illustrates a preferred embodiment of the present invention for acquiring echo planar spectroscopic imaging (EPSI) for a slice defined by two spatial dimensions. As indicated, STE localization is first performed in accordance with the present invention in order to localize the region of interest within a selected slice. The EPSI sequence spatially encodes the y-direction, and conventional phase encoding is used in the x-direction. It is noted, however, that three-dimensional spatial encoding generally has advantages over multi-slice methods, since continuous volume coverage and very thin slices can be obtained, and since chemical shift artifacts in the slice selection direction are avoided.

It is further noted that although a preferred embodiment of the present invention is directed to spectroscopic imaging, the oversampling technique can be extended to conventional echo planar MR imaging to eliminate aliasing artifacts.

In accordance with the present invention, then, numerous advantages and attendant advantages are realized. For instance, STE localization with spatial presaturation applied both before the STE sequence and during the TM interval of STE sequence improves the degree of suppression by several orders of magnitude. Moreover, more presaturation pulses can be applied to shape the volume of interest with greater flexibility than prior art methods, and without sacrificing saturation efficiency due to T1 relaxation, for example. Further, the STE localization sequence allows the use of short echo times. In addition, n-fold oversampled EPSI sequences result in increased immunity to spectral-spatial convolution effects, and are well suited for separating even and odd echoes, thus further improving localization and rendering EPSI more practicable. These and other related features related to improved spatial localization and acquisition speed, result in a preferred embodiment for high speed EPSI.

The following example is presented to illustrate features and characteristics of lute present invention which is not to be construed as being limited thereto.

EXAMPLE

The present invention has been implemented on a conventional, clinical 1.5 Tesla whole body MRI scanner (GE Medical Systems, Milwaukee, Wis.) equipped with 10 mT/m actively shielded whole body gradients. Measurements with water suppression have been performed on phantoms and in vivo in the human brain.

In such an experiment, an HSI pulse sequence corresponding to FIG. 3 was employed, except that the echo planar spatial-spectral encoding was performed along the y-axis, corresponding to an in-plane direction. STE RF pulses of 2 ms length, gradient ramps of 500 us and 2 ms gradient crusher pulses were employed, resulting in 10 msec echo times. All three STE—slice selective pulses selected the same axial slice.

Figure 8:
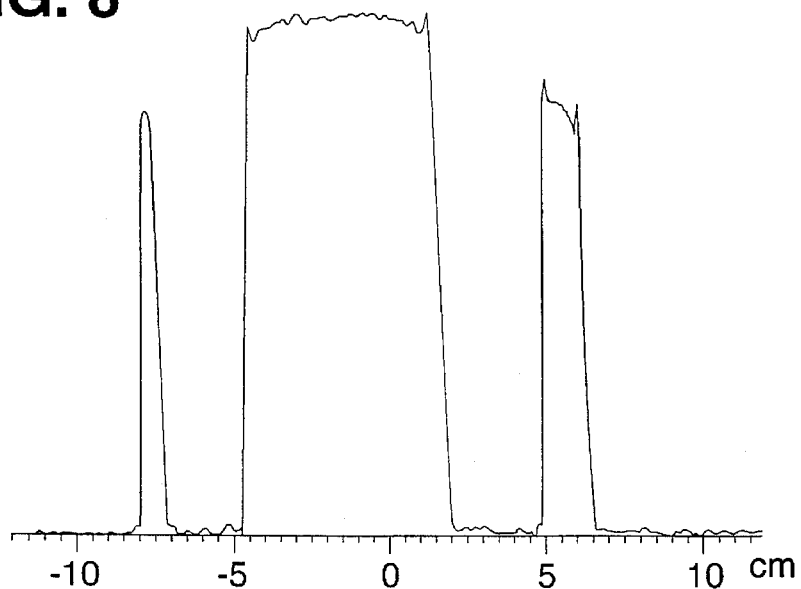
FIG. 8 shows a suppression slice profile in a selected line from the spatial suppression in the phantom of FIG. 7, in accordance with the present invention.
Figure 7:
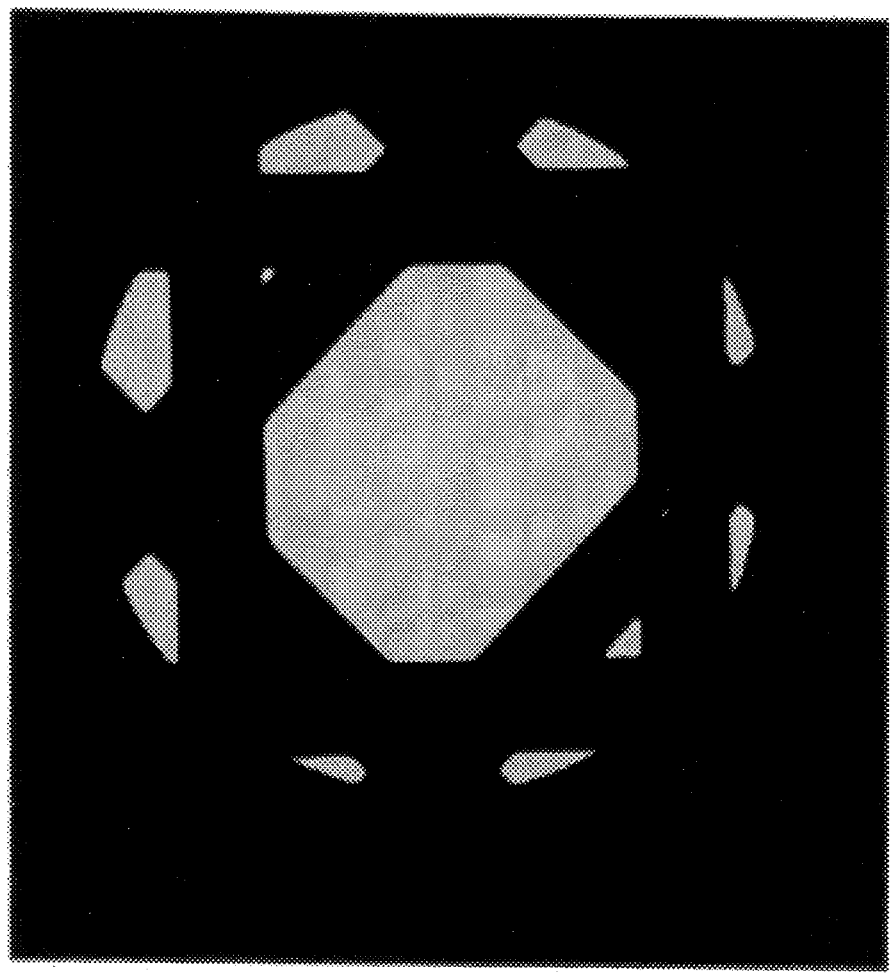
FIG. 7 illustrates octagonal spatial suppression in a phantom, in accordance with the present invention.

Sixteen 3 ms long spatial suppression pulses (eight in each suppression interval SS1,SS2) with subsequent 4 ms gradient dephasing pulses were employed for flexible suppression of multiple 4 cm thick slices around the volume of interest, orthogonal to the STE-selected slice. Four optional pulses (two in each suppression interval) for additional suppression above and below the slice of interest were available, but not used in this study. The suppression slices were positioned along the contours of the brain to include as much grey matter as possible inside the spectroscopic volume preselection. An example of the spatial suppression on a phantom is shown in FIG. 7. Chemical shift selective (CHESS) pulses with a bandwidth of 75 Hz were used for water suppression in the WS1 and WS2 intervals, typically using three pulses in WS1 and only one pulse in WS2. The flip angles and timing sequence of the water suppression pulses were numerically optimized according to known techniques. A user-friendly interface, which was supported by graphic prescription, was used to independently enter the position, orientation, and width of each suppression slice. The water suppression and spatial suppression pulses were adjusted to compensate for T1-relaxation effects. On phantoms, uniform several hundred fold spatial suppression was obtained. The width of the transition regions from minimum to maximum suppression was less than 10% of the saturation slice width as shown in FIG. 8.

A spectral width $\beta$ of 488 Hz in individual spectra was encoded. The echo planar gradient in the y-direction was periodically inverted every 1024 μsec ($1/2\beta$) with two-fold oversampling during the entire spectroscopic acquisition to resolve the y dimension. The gradient ramp time from zero to maximum gradient amplitude was hardware-limited and varied with spatial resolution and gradient axis. For a nominal spatial resolution of 5 mm and a gradient amplitude of 4.6 mT/m the ramp time was approximately 160 us. For nominal resolutions of 7.5 mm and 10 mm the ramp time were approximately 110 and 80 us, respectively. For each data trace, 16384 complex data points (i.e., 512 spectral points*32 spatial points) were sampled continuously with a data bandwidth of 32 kHz to yield a frequency resolution of 1.95 Hz. No gradient tuning was required. Data acquisition and echo-planar gradient encoding started 1 ms prior to the top of the stimulated echo to minimize first order phase errors in the spectra. The other dimensions (i.e., x and z) were localized with conventional phase encoding.

Data processing was performed using the SMGE software (GE Medical Systems, Milwaukee, Wis.) on a SUN Sparc II workstation. Data representing "even" and "odd" echoes were rearranged to yield separate data sets and processed separately. Each edited echo-planar data trace was reformatted into a 2-dimensional submatrix to separate spatial and spectral information. Spectral filtering consisted of a 2 Hz exponential line-broadening. Mild Fermi filtering in the spatial domains (radius: $0.9*k_{max}$, width: $0.2*k_{max}$) was employed to reduce Gibb's ringing. Residual water signals were removed by low frequency filtering in the time domain as follows: A binomial filter of 131 points width was applied to the spatially localized time domain data and the result was subtracted from the original. This filtering strongly reduced residual water signals with negligible effect on metabolite signals outside of a spectral range between 3.9 and 4.5 ppm. Local shifts in peak position due to inhomogeneities in the magnetic field strength were automatically corrected by referencing to the position of n-acetyl aspartate (NAA). Zero order phase correction was performed automatically. "Even" and "odd" echo absorption mode spectra were added to maintain signal-to-noise. Spectroscopic images were created in magnitude mode by spectral integration over a spectral width of 12 Hz.

For the in vivo studies, rapid multi-slice gradient-recalled echo scans (TR: 100 ms, TE: 5 ms) were obtained in order to select the volume of interest. Since the stimulated echo part of the pulse sequence may be converted into a volume selective pulse sequence by changing the orientations of the slice selection gradients, this technique was sometimes used to move the selected volume into regions containing lipids for localized tuning of outer volume suppression pulses. Typically, a 4.5 cm thick axial slab at the level of the lateral ventricle was preselected. In accordance with the above described experimental parameters, echo-planar read-out gradients were employed along the y-axis (i.e., orthogonal to the 4.5 cm thick axial direction) to encode 32 slices with a nominal spatial resolution of 7.5 mm. The nominal x-z cross-sectional resolution was 1 cm. First and second order shimming on the volume of interest was performed manually. EPSI data were acquired at TR: 2000 msec, TE: 13 msec, and TM: 120 msec. A 2*32*8 k-space was sampled with a 32*32*6 $cm^3$ field of view using four averages. Accordingly, the nominal voxel size was 0.75 $cm^3$. The total data acquisition time was 34 minutes.

Figure 9:
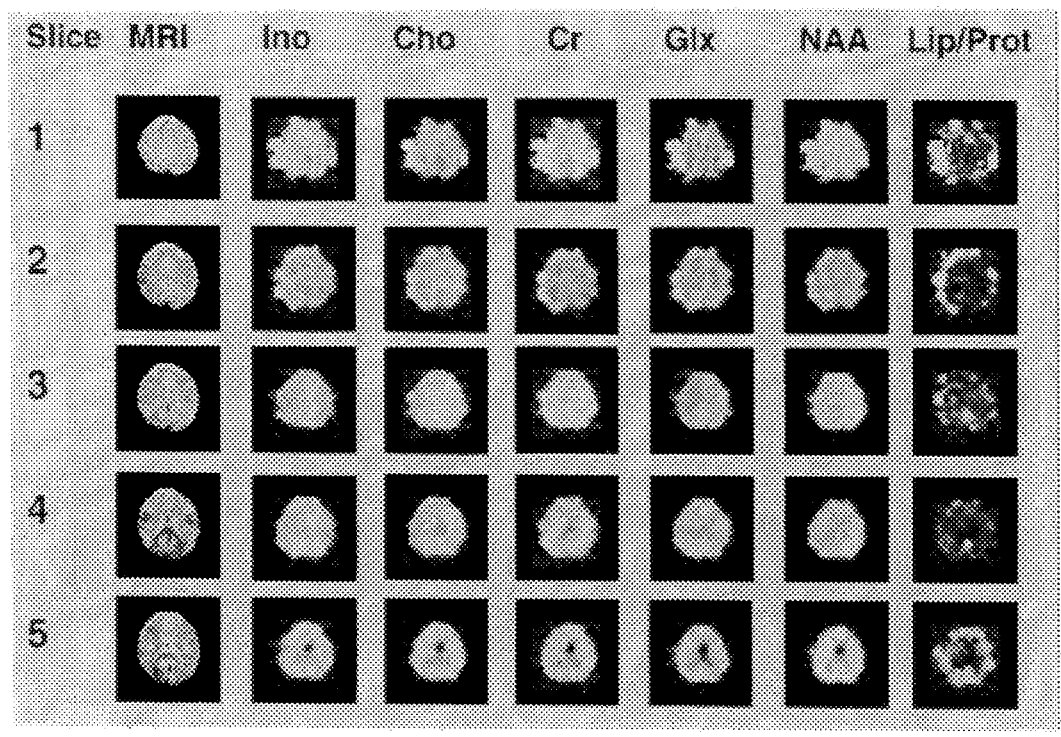
FIG. 9 shows the five central slices for three-dimensional oversampled EPSI performed on a normal volunteer, in accordance with the present invention.
Figure 10:
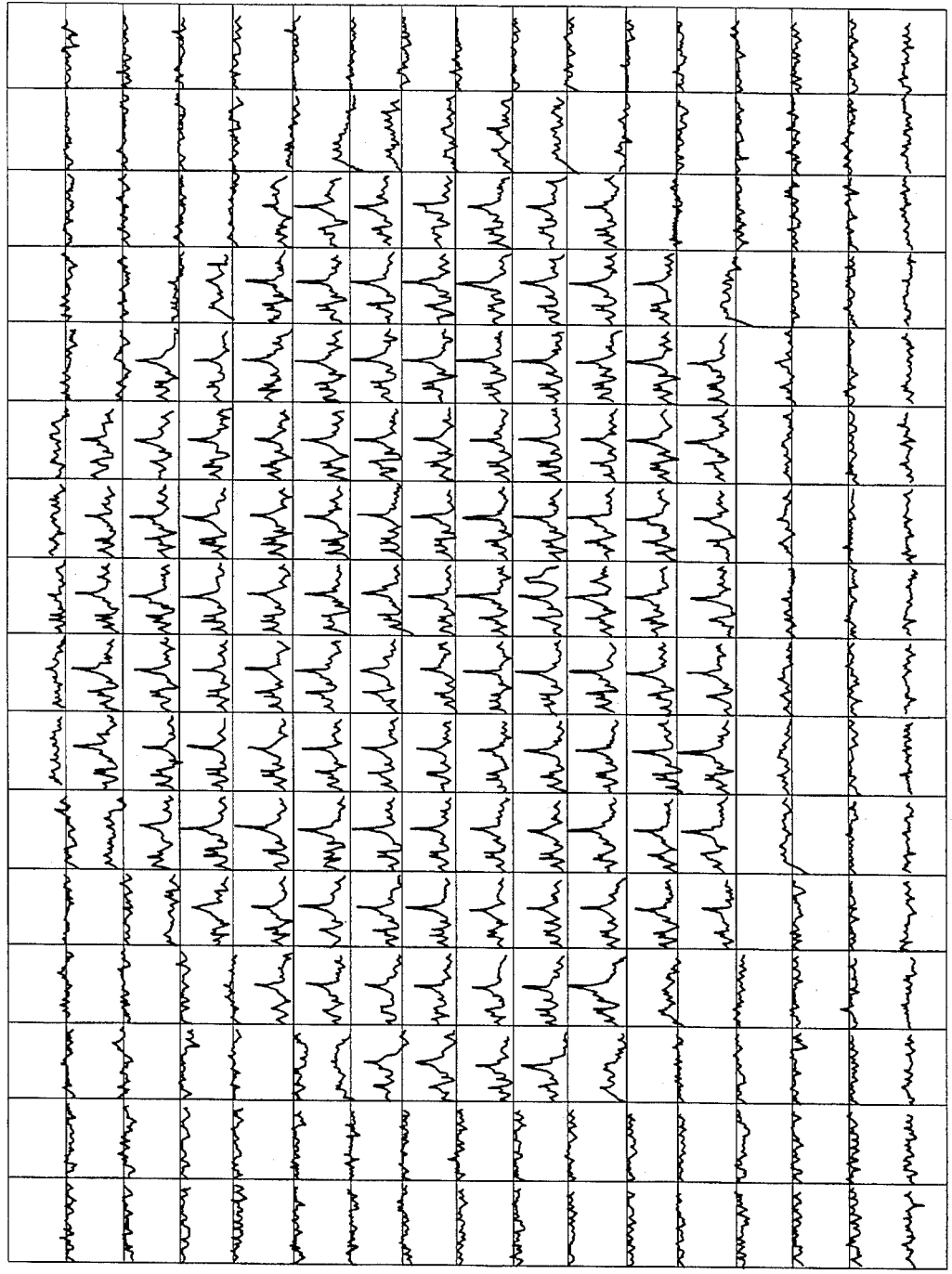
FIG. 10 is a zoomed spectral array from the fourth slice of FIG. 9, obtained in accordance with the present invention.
Figure 11:
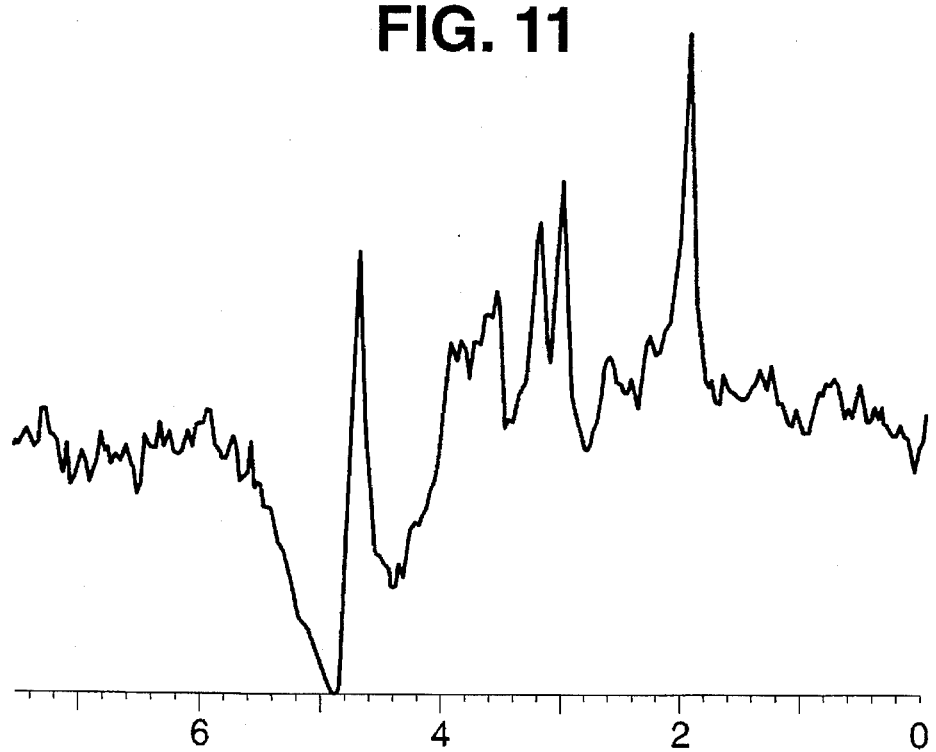
FIG. 11 is an individual spectrum from the array in FIG. 10, displaying the entire spectral range, obtained in accordance with the present invention.

Spectroscopic images obtained in human brain together with the corresponding localizer images (MRI) are shown in FIG. 9. Due to the short echo time used in this study it was possible not only to detect singlet resonances from choline (CHO), creatine (CR) and n-acetyl aspartate (NAA), but also to detect multiplet signals from inositol (Ino), glutamate/glutamine (Glx) and cytosolic proteins (Prot). In the bottom slice 5 the ventricular spaces are clearly visible. Residual water and lipid signals from superficial regions were strongly reduced to or below the level of the metabolite resonances. The spectral quality was very consistent in different voxels as evidenced by FIG. 10, which shows a zoomed spectral array from slice 4 in FIG. 9 for a spectral range from 1 to 3.7 ppm with major resonances from Cho, Cr, and NAA, and which also evidences the excellent lipid suppression in the periphery. Moreover, the spectral quality was very similar to that obtained with conventional methods, as evidenced by FIG. 11, which shows an individual spectrum from the array in FIG. 10, and in which displays the whole spectral range, rendering visible singlet resonances from Cho (3.24 ppm), Cr (3.03 ppm) and NAA (2.02 ppm), as well as multiplet resonances from Ino (3.56 ppm), Glx (2.35 ppm) and Prot (0–2 ppm). The signal to noise ratio of NAA was between 10 and 15 in well resolved voxels which was consistent with results obtained with conventional planar HSI in the same time frame. Due to spectral-spatial oversampling the water signal could be positioned on resonance and signals that fell outside of the spectral window on the right side, aliased back appearing on the left side. The experimental results indicate that there is no loss in signal to noise per unit time and unit volume as compared to conventional techniques. In addition, the experimental results indicate that higher order shimming is important to limit spectral linebroadening and frequency shifts when acquiring data from large brain volumes. Similarly, appropriate postprocessing methods with automated correction of frequency shifts due to residual magnetic field inhomogeneities improved the representation of the metabolite signal distributions.

In addition to the volume encoded HSI experiments, single slice (i.e., two spatial dimensions) HSI was performed using a pulse sequence corresponding to FIG. 6. Many of the features of the pulse sequence and protocol follow the volume encoded HSI example discussed above. In this single slice experiment, echo-planar encoding was performed along the y-axis of the slice to acquire 16384 complex points (=512 spectral points * 32 spatial points) using a spectral width of 32 kHz to yield a digital frequency resolution of 1.95 Hz. No gradient tuning was required. The x-dimension was localized with conventional 32 step phase encoding. Water-suppressed and non water-suppressed spectroscopic imaging data acquired at TR: 2000 ms, 13 ms and TM: 120 ms from 1 or 2 cm thick axial slices. Using these parameters, the acquisition time for a 32*32 spatial matrix was about 64 seconds. When necessary, averaging was performed to improve the signal to noise ratio.

As evinced by the experimental results, currently available gradient hardware on commercial whole body scanners is well suited for applications of echo-planar HSI in human brain without introducing significant localization artifacts and spectral distortions. Active gradient shielding as well as powerful and stable gradient amplifiers are important for achieving the required gradient performance. For a spatial resolution of better than 5 mm it will be necessary to achieve faster gradient ramp times, for example by using dedicated head gradient sets or by employing more powerful gradient amplifiers. Future implementation of echo-planar HSI will benefit from more powerful whole body gradients which will soon be available fix echo-planar imaging. In addition, the increased acquisition speed provided in accordance with the present invention may be more fully exploited as phased array surface coils and higher field strengths become available. This implementation of the present invention may ultimately lead to functional HSI with a time resolution of a few minutes.

Thus, as illustrated through the preferred embodiment and the foregoing example, and as understood by further practicing the present invention, many advantages and attendant advantages are provided by the present invention, the features of which include improved spatial localization and rapid data acquisition for generating high resolution spectroscopic images. From a research and clinical point of view the short acquisitions time reduces the risk of motion artifacts that makes spectroscopic imaging very difficult to perform in some clinical conditions, for example with children, cognitively impaired patients and patients with movement disorders. It also enables multiple measurements under different experimental conditions and time courses. The flexibility of positioning and shaping the region of lipid suppression, as well as the degree of lipid suppression achieved even with surface coils, enhances the capacity of studying cortical brain structures close to lipid containing regions. Improved localization and increased acquisition rate renders further improvements and implementations feasible, such as multi-dimensional spectral editing (e.g., correlated spectroscopy "COSY", nuclear overhauser enhanced spectroscopy "NOESY", etc.), combination with other localization methods, and spatial localization and encoding over a volume of interest without the need for slice selectivity of the STE pulses.

Figure 12A:
FIG. 12A schematically illustrates a series of RF pulses used for generating stimulated echoes.
Figure 12B:
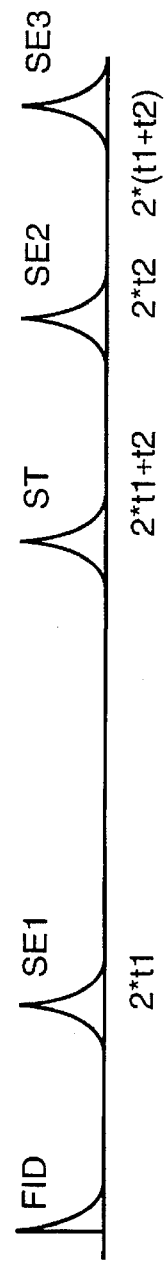
FIG. 12B shows the available spin echoes and the stimulated echo, and their respective effective echo time, generated by the RF pulse sequence of FIG. 12A.

In accordance with the present invention, multiple echo techniques are also provided. FIG. 12B illustrates all echo signals induced by a radio frequency pulse sequence (FIG. 12A) that is generally used for stimulated echo techniques (i.e., 90° pulse RF1—delay time t1—90° pulse RF2—delay time t2—90° pulse RF3). These induced signals include: free induction decay signal FID, stimulated echo signal ST, and spin echo signals SE1, SE2, and SE3.

It is understood that signal FID results from the spins excited by pulse RF1. Pulse RF2 refocusses these spins, resulting in spin echo signal SE1 at a time equal to 2t1. Further, pulse RF3 refocusses spin echo SE1, resulting in spin echo SE2 at a time 2t2, and also refocusses the spins associated with signal FID at a time 2(t1+t2), giving rise to spin echo SE3.

Figure 12C:
FIG. 12C schematically illustrates a magnetic field gradient pulse sequence applied in conjunction with the RF pulses for generating the stimulated echo and suppressing the spin echoes.

FIG. 12C illustrates, in a general manner, pulse gradients applied in one or more directions for providing the stimulated echo ST) while suppressing undesired echo signals. With conventional STEAM techniques, and with techniques according to some embodiments of the present invention, gradients $G1_a$ and $G1_b$, known in the art as dephasing or "crusher" gradients, are employed to suppress all echoes except for the stimulated echo ST. Similarly, gradient G2, generally representing gradients applied during the TM interval (i.e., interval t2) may also be applied to dephase the spins of unwanted echoes. According to an embodiment of the present invention, G2 also represents any gradients applied during the TM interval that are associated with a suppression or localization sequence.

In the conventional STEAM techniques, in which localization is achieved for example by applying orthogonal slice selection gradients, suppression of the spin echo signals is generally desired because each echo originates from a different subvolume of the object. Also, according to prior art STEAM techniques, only the stimulated echo and the second spin echo are fully localized in three dimensions.

In accordance with an embodiment of the present invention, a stimulated echo pulse sequence provides multiple echoes at different effective echo times without compromising spatial localization of the different echoes. That is, since in accordance with the STE pulse sequence of the present invention the same slice is excited by all three radio frequency pulses, all echoes originate from the same slice.

Figure 12D:
FIG. 12D schematically illustrates a magnetic field gradient pulse sequence applied in conjunction with the RF pulses for generating the stimulated echo and the third spin echo, in accordance with the present invention.

For multi-echo observations it is necessary to modify the gradient scheme to refocus different echoes. For example, as shown in FIG. 12D, in order to observe the spin signal SE3 generated from the free induction decay signal FID following the first radio frequency pulse RF1 by the third radio frequency pulse RF3, an additional gradient G2 compensating the gradient(s) applied during the TM interval (i.e., represented by gradient G2) is used to dephase the stimulated echo ST and to rephase the third spin echo signal SE3. In FIG. 12D, therefore, the area of gradient G2 (i.e., the integral of the magnetic field gradient over time) equals the area of the additional (or "rephasing") gradient $G2_x$. It is understood that one skilled in the art may appropriately provide gradient pulses to observe any combination of the available spin echoes SE1, SE2, and SE3 in addition to the stimulated echo ST.

It is also understood that the pulse sequences shown in FIGS. 12A–12D merely schematic, and are provided to illustrate principles involved in practicing the present invention, including the spin echoes that may be observed, the characteristics of the spin echoes according to the present invention, and the use of an additional gradient to compensate gradients that dephase the desired spin echo signals. Since these dephasing gradients in practice may be applied in myriad ways (e.g., directions) and generally there are myriad pulse sequence variations available to one skilled in the art, FIGS. 12A–D are directed to simply illustrating the principles involved in practicing the invention. Therefore, although FIG. 12D shows only a single gradient G2 applied in the same direction as a single refocussing or rephasing gradient G2$_r$, each of these gradients may represent one or more gradient pulses, and further, similar principles pertain to dephasing gradients that may be applied in other directions. In addition, it is understood that additional RF pulses may be used to refocus one or more of the spin echoes, thereby providing additional echoes with different echo times. These principles and other pulse sequence design principles are well known to one skilled in the art. As a further example of the many modifications that are possible in accordance with the present invention, and as discussed previously, it is not essential that a slice selection magnetic field gradient pulse is applied with each RF pulse provided that the acquired echoes arise from the same localized region.

Figure 13A:
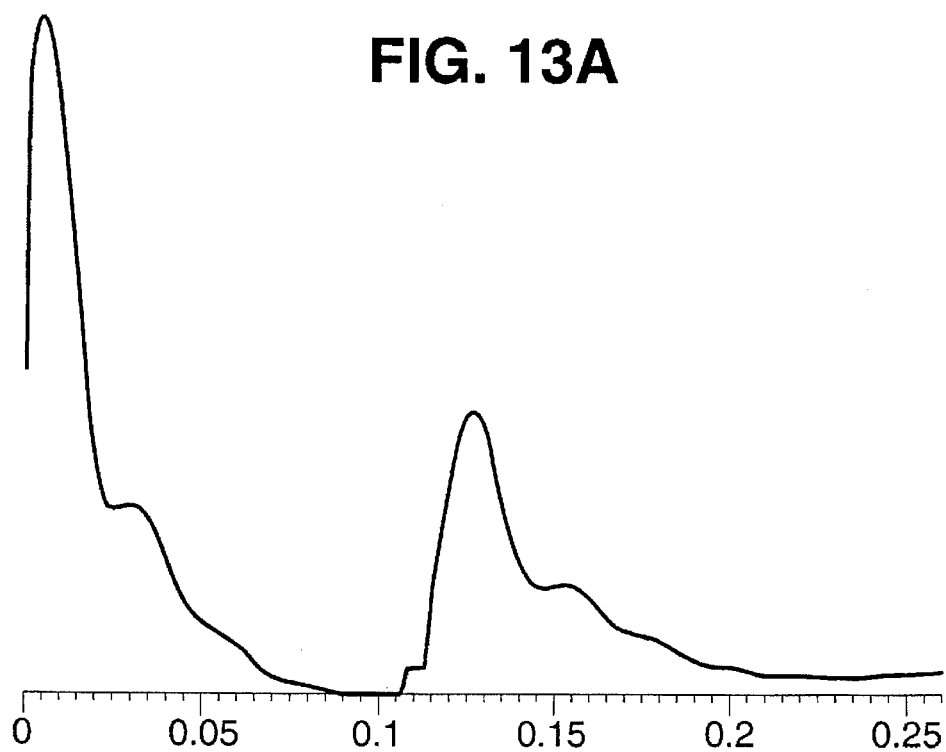
FIG. 13A shows experimental raw data for a spin echo acquired subsequent to a stimulated echo, in accordance with the present invention.
Figure 13B:
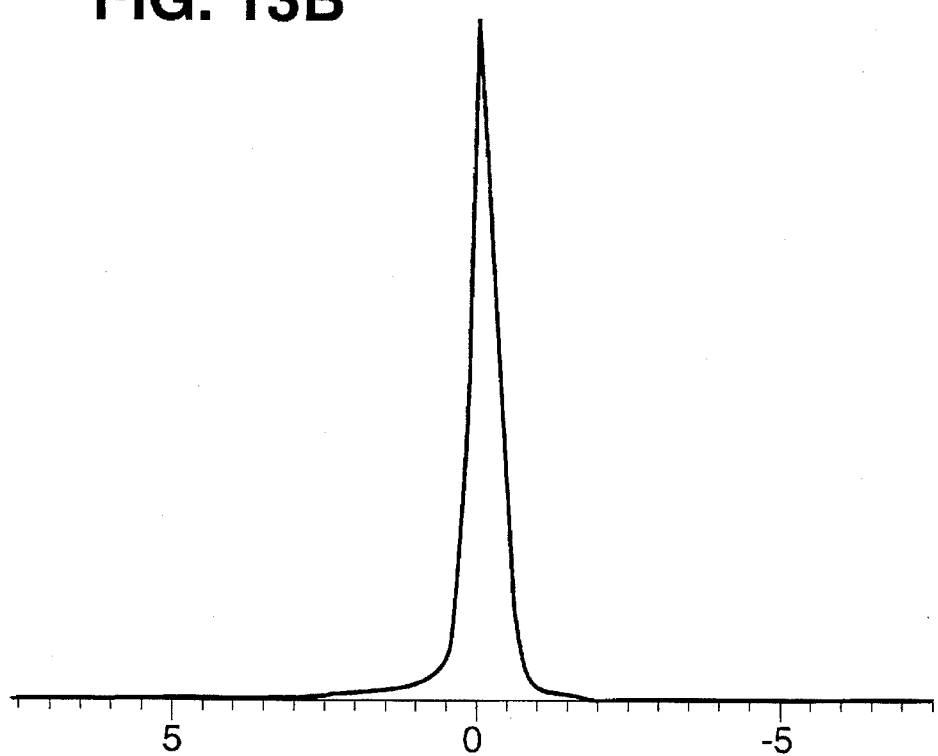
FIG. 13B is the absorption mode spectrum of the stimulated echo of FIG. 13A.
Figure 13C:
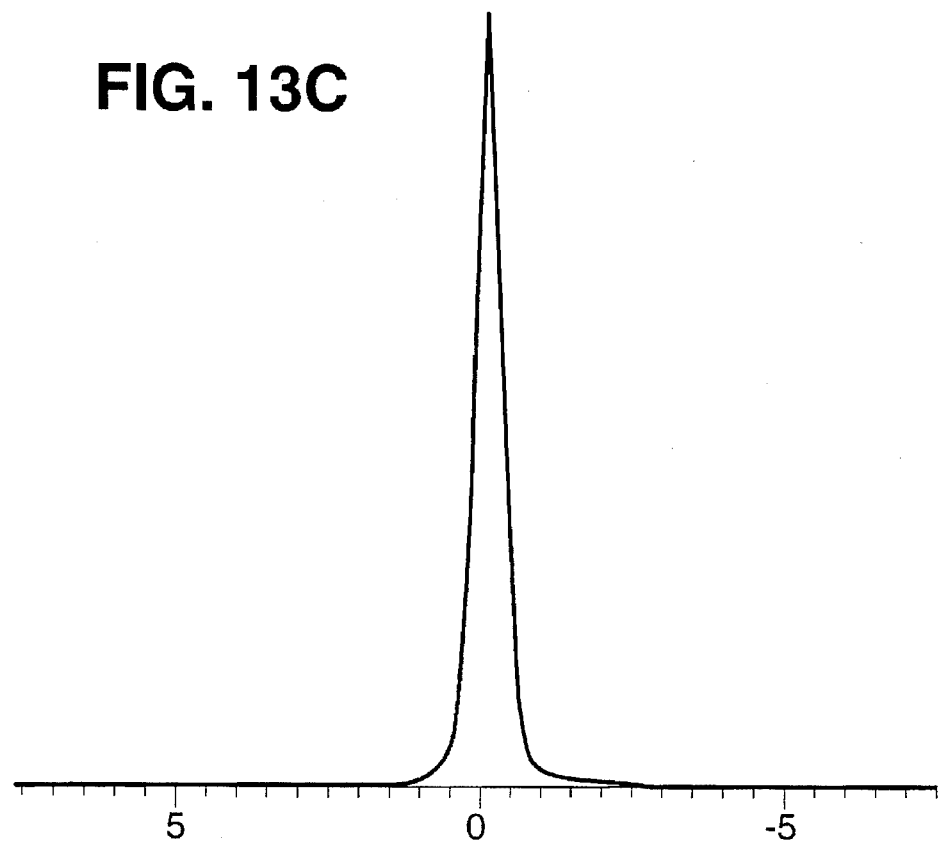
FIG. 13C is the absorption mode spectrum of the spin echo of FIG. 13A.

As a practical example, not intended to limit the scope of the present invention, a TM period of 121 ms and a TE of 15 ms for the stimulated echo results in an effective spin echo time of 272 ms for the third spin echo, which is commonly used for lactate detection. The stimulated echo is observable for approximately 110 ms, which corresponds to a spectral resolution of 9.1 Hz, until the third spin echo (e.g., SE3 of FIG. 12B) is refocussed by applying a refocussing gradient (e.g., G2, of FIG. 12D). While this spectral resolution is undersampling singlet lines at clinical field strengths (1.5 Tesla), it is more adequate for measurements at higher field strengths (e.g. 4 Tesla) where spectral linewidths are generally broader. FIGS. 13A–13C depict actual data from an experimental example conducted at 1.5 Tesla using double echo acquisition on a water phantom with TE of the stimulated echo equal to 20 msec and a TM equal to 120 msec. More particularly, FIG. 13A show the raw data (real part) of a stimulated echo and a subsequent spin echo which was refocussed 120 msec after the stimulated echo. FIG. 13B and FIG. 13C show the absorption mode spectra for the stimulated echo and for the spin echo, respectively, after separating the echoes in the time domain and performing a Fourier Transform.

It may be appreciated that many advantages may be derived from acquiring one or more of these spin echo signals in addition to the stimulated echo signal. For instance, transverse relaxation rates and J-coupling are commonly measured by performing multiple localized spectroscopy experiments at different echo times, a method which is very time consuming. According to the present invention, a single spectroscopic experiment may provide information for determining the transverse relaxation rates and J-coupling in addition to the spectroscopic information. The acquired spin echo signals may also be used for observing resonances that have improved contrast at longer echo times (e.g., signals from lactate as opposed to signals from fat and water). Moreover, by adding data obtained at different echo times it is also possible to improve the signal to noise ratio in localized spectra.

Although the above description provides many specificities, these enabling details should not be construed as limiting the scope of the invention, and it will be readily understood by those persons skilled in the art that the present invention is susceptible to many modifications, adaptations, and equivalent implementations without departing from this scope. For example, although the invention is particularly well adapted for use with NMR proton spectroscopy for improving localization and increasing the acquisition rate, it will be appreciated that this is illustrative of only one utility of the invention, and that the modified STE localization and/or the oversampled echo-planar technique may be readily adapted for use with conventional imaging. Also, a plurality of oversampled EPSI sequences may be applied in different directions in interleaved manner; for example, a first oversampled EPSI sequence may be applied in the y-direction, and a second oversampled EPSI sequence may be applied in the z-direction, interleaved such that within the duration of a readout gradient pulse of the first oversampled EPSI sequence, the entire second oversampled EPSI sequence is applied. In addition, while proton spectroscopic imaging is described, the invention is readily applicable to the other elements, such as sodium or phosphorus.

These and other changes can be made without departing from the spirit and the scope of the invention and without diminishing its attendant advantages. It is therefore intended that the present invention is not limited to the disclosed embodiments but should be defined in accordance with the claims which follow.

We claim:

1. A method of acquiring magnetic resonance spectroscopic information from a volume of interest of a sample located in a magnetic field, said method comprising the steps of:

applying a series of radio frequency pulses and a respective series of magnetic field gradient pulses to said sample, each combination of one of said radio frequency pulses and respective one of said magnetic field gradients exciting spins in a substantially identical slice of said sample, and wherein said series of radio frequency pulses induces a stimulated echo and a spin echo signal;

applying a magnetic field gradient which causes dephasing of spins associated said spin echo signal;

applying an echo selection magnetic field gradient pulse a predetermined time after said stimulated echo is initiated for dephasing said stimulated echo and for rephasing spins associated with said spin echo signal; and acquiring said stimulated echo and said spin echo signal in the absence of a readout gradient.

2. The method according to claim 1, wherein said spin echo signal is induced according to refocussing by one of said radio frequency pulses of spins excited by a previous one of said radio frequency pulses.

3. The method according to claim 1, wherein said spin echo signal is induced according to refocussing by one of said radio frequency pulses of a previous spin echo.

4. The method according to claim 3, further comprising the step of acquiring said previous spin echo.

5. The method according to claim 1, wherein said series of radio frequency pulses includes a series of 90° RF pulses, each 90° RF pulse of said series being applied during the application of a respective one of said magnetic field gradient pulses.

6. The method according to claim 5, wherein said series of 90° radio frequency pulses includes a first 90° radio frequency pulse followed by a second 90° radio frequency pulse followed by a third 90° radio frequency pulse, and said spin echo signal is induced according to refocussing by the third 90° radio frequency pulse of spins excited by the first 90° radio frequency pulse.

7. The method according to claim 6, further comprising the step of acquiring an additional spin echo signal induced according to refocussing by the third 90° pulse of a first spin echo which is induced according to refocussing by the second 90° radio frequency pulse of spins excited by the first 90° radio frequency pulse.

8. The method according to claim 7 wherein said additional spin echo signal is generated between said stimulated echo and said spin echo signal.

9. The method according to claim 5, wherein said series of 90° radio frequency pulses includes a first 90° radio frequency pulse followed by a second 90° radio frequency pulse followed by a third 90° radio frequency pulse, and further comprising the step of acquiring an additional spin echo signal which is induced according to refocussing by the second 90° pulse of spins excited by the first 90° pulse.

10. The method according to claim 5, wherein said series of 90° radio frequency pulses includes a first 90° radio frequency pulse followed by a second 90° radio frequency pulse followed by a third 90° radio frequency pulse wherein said spin echo signal is induced according to refocussing by the third 90° pulse of a first spin echo which is induced according to refocussing by the second 90° radio frequency pulse of spins excited by the first 90° radio frequency pulse.

11. The method according to claim 5, wherein said series of 90° radio frequency pulses includes a first 90° radio frequency pulse followed by a second 90° radio frequency pulse followed by a third 90° radio frequency pulse, and further comprising the steps of applying a first suppression sequence before said first 90° radio frequency pulse, and applying a second suppression sequence between said second 90° radio frequency pulse and said third 90° radio frequency pulse.

12. A method of acquiring spectroscopic magnetic resonance information from a volume of interest comprising the steps of:

applying a stimulated echo pulse sequence to induce a stimulated echo and a spin echo signal in said volume of interest, said stimulated echo pulse sequence including a magnetic field gradient which causes dephasing of spins associated with said spin echo signal; and applying a rephasing magnetic field gradient after said stimulated echo is initiated to compensate for dephasing of spins associated with said spin echo signal, thereby rephasing said spin echo signal while dephasing spins associated with said stimulated echo; and acquiring said stimulated echo and said spin echo signal.

13. A method of acquiring magnetic resonance information from a volume of interest comprising the steps of:

applying a presuppression sequence to saturate volumes outside the volume of interest;

applying a series of three 90° RF pulses to induce a stimulated echo and a spin echo signal within said volume of interest;

applying a respective gradient pulse during the application of at least one 90° RF pulse of said three 90° RF pulses, thereby providing slice selection;

applying a suppression sequence during an interval between second and third of said series of three 90° RF pulses to saturate volumes outside the volume of interest, and wherein said presuppression sequence and said suppression sequence define the volume of interest in at least two spatial dimensions;

applying a magnetic field gradient which causes dephasing of spins associated said spin echo signal;

applying a rephasing gradient to compensate for dephased spins associated with said spin echo signal; and acquiring said stimulated echo and said spin echo.

14. A magnetic resonance system for acquiring information from a volume of interest, said system comprising:

means for applying a first suppression pulse sequence;

means for applying, after said first suppression pulse sequence, a stimulated echo pulse sequence to induce a stimulated echo and a spin echo in said volume of interest, wherein said stimulated echo pulse sequence includes a second suppression pulse sequence during a mixing time period of said stimulated echo pulse sequence, said first and second suppression pulse sequences defining said volume of interest; and means for acquiring said stimulated echo and said spin echo.

15. A magnetic resonance system for acquiring spectroscopic information from a volume of interest of a sample, said system comprising:

means for applying a stimulated echo pulse sequence to induce a stimulated echo and at least one spin echo signal in said volume of interest, all spins of each one of said at least one spin echo signal located in substantially the same location of said sample, said stimulated echo pulse sequence including a magnetic field gradient which causes dephasing of the spins associated with said at least one spin echo signal;

means for applying an echo selection magnetic field gradient pulse a predetermined time after said stimulated echo is initiated for dephasing said stimulated echo and for rephasing spins associated with one or more of said at least one spin echo signal; and means for acquiring said stimulated echo signal and said one or more of said at least one spin echo signal.

16. A method of acquiring spectroscopic magnetic resonance information from a volume of interest of a sample located in a magnetic field, said method comprising the steps of:

applying a series of radio frequency pulses to said sample for inducing a stimulated echo and a spin echo signal;

applying at least one magnetic field gradient pulse, each one of said at least one magnetic field gradient pulses applied substantially in the same direction with each other, and applied substantially simultaneously with a respective one of said series of radio frequency pulses;

applying a magnetic field gradient which causes dephasing of spins associated said spin echo signal;

applying an echo selection magnetic field gradient pulse a predetermined time after said stimulated echo is initiated for dephasing said stimulated echo and for rephasing spins associated with said spin echo signal; and acquiring said stimulated echo and said spin echo signal.

* * * * *